(12) United States Patent
Brandl et al.

(10) Patent No.: US 9,130,136 B2
(45) Date of Patent: Sep. 8, 2015

(54) LEADFRAME FOR OPTOELECTRONIC COMPONENTS AND METHOD FOR PRODUCING OPTOELECTRONIC COMPONENTS

(75) Inventors: Martin Brandl, Kelheim (DE); Tobias Gebuhr, Regensburg (DE); Markus Pindl, Tegernheim (DE); Albert Schneider, Thalmassing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/885,912

(22) PCT Filed: Jan. 31, 2012

(86) PCT No.: PCT/EP2012/051582
§ 371 (c)(1),
(2), (4) Date: Jul. 31, 2013

(87) PCT Pub. No.: WO2012/119813
PCT Pub. Date: Sep. 13, 2012

(65) Prior Publication Data
US 2013/0309788 A1    Nov. 21, 2013

(30) Foreign Application Priority Data
Mar. 7, 2011 (DE) .......... 10 2011 013 259
Apr. 8, 2011 (DE) .......... 10 2011 016 566

(51) Int. Cl.
*H01L 23/495* (2006.01)
*H01L 33/62* (2010.01)
(Continued)

(52) U.S. Cl.
CPC .............. *H01L 33/62* (2013.01); *H01L 21/561* (2013.01); *H01L 33/0095* (2013.01); *H01L 23/49541* (2013.01); *H01L 23/49548* (2013.01); *H01L 24/29* (2013.01); *H01L 24/83* (2013.01); *H01L 24/97* (2013.01); *H01L 2224/29191* (2013.01); *H01L 2224/32245* (2013.01); *H01L 2224/83192* (2013.01); *H01L 2924/00013* (2013.01); *H01L 2924/12041* (2013.01)

(58) Field of Classification Search
CPC .............. H01L 33/62; H01L 23/49541; H01L 23/49548
USPC .......................................... 257/669, E23.043
See application file for complete search history.

(56) References Cited

U.S. PATENT DOCUMENTS 7,078,254 B2    7/2006  Loh
7,812,432 B2 *  10/2010 Hou et al. ............ 257/676
(Continued)

FOREIGN PATENT DOCUMENTS

DE    1 003 812 B    3/1957
JP    58-095852 A    6/1983
(Continued)

*Primary Examiner* — Amar Movva
(74) *Attorney, Agent, or Firm* — Slater & Matsil, L.L.P.

(57) ABSTRACT

A leadframe for producing a number of optoelectronic components is specified. At least one mounting region includes a number of chip mounting areas for a number of semiconductor chips. Alongside the mounting region at at least one main area of the leadframe one or more of grooves for reducing mechanical stresses in the leadframe are formed. The groove(s) do not completely penetrate through the leadframe. A method for producing a number of optoelectronic components on a leadframe of this type is furthermore specified.

14 Claims, 6 Drawing Sheets (51) Int. Cl.
    *H01L 21/56*     (2006.01)
    *H01L 33/00*     (2010.01)
    *H01L 23/00*     (2006.01)

(56) References Cited

U.S. PATENT DOCUMENTS

| | | |
|---|---|---|
| 2002/0001244 A1 | 1/2002 | Ohtake |
| 2002/0163015 A1 | 11/2002 | Lee et al. |
| 2005/0104169 A1 | 5/2005 | Huat et al. |
| 2005/0184364 A1 | 8/2005 | Kim et al. |
| 2007/0126020 A1 | 6/2007 | Lin et al. |
| 2008/0042151 A1* | 2/2008 | Oh et al. ................. 257/88 |
| 2010/0187546 A1 | 7/2010 | Fushimi et al. |

FOREIGN PATENT DOCUMENTS

| | | | |
|---|---|---|---|
| JP | 59-086251 | A | 5/1984 |
| JP | 62-115752 | A | 5/1987 |
| JP | 06-021317 | A | 1/1994 |
| JP | 992895 | A | 4/1997 |
| JP | 2002184914 | A | 6/2002 |
| JP | 2004522297 | A | 7/2004 |
| JP | 2005235997 | A | 9/2005 |
| JP | 2006509373 | A | 3/2006 |
| JP | 200916636 | A | 1/2009 |
| JP | 200959909 | A | 3/2009 |
| JP | 2010129923 | A | 6/2010 |
| TW | 550716 | B | 9/2003 |

* cited by examiner

LEADFRAME FOR OPTOELECTRONIC COMPONENTS AND METHOD FOR PRODUCING OPTOELECTRONIC COMPONENTS

This patent application is a national phase filing under section 371 of PCT/EP2012/051582, filed Jan. 31, 2012, which claims the priority of German patent application 10 2011 013 259.7, filed Mar. 7, 2011, and German patent application 10 2011 016 566.5, filed Apr. 8, 2011, each of which is incorporated herein by reference in its entirety.

TECHNICAL FIELD

The invention relates to a leadframe for producing a multiplicity of optoelectronic components and a method for producing a multiplicity of optoelectronic components.

BACKGROUND

During the production of optoelectronic components such as LEDs, for example, the semiconductor chips are often mounted on leadframes serving for making electrical contact with the optoelectronic component. A housing and/or a lens for the optoelectronic component can be produced by compression molding or injection molding, for example, wherein a plastic such as, for example, a thermoplastic, a thermosetting plastic or an elastomer is applied to at least one side of the leadframe. During the automated manufacture of LEDs, generally a multiplicity of semiconductor chips are simultaneously mounted onto a leadframe comprising a multiplicity of chip mounting areas and are subsequently simultaneously encapsulated with the housing material by molding or injection molding and the leadframe is subsequently singulated by sawing, for example, to form individual optoelectronic components.

Outside the mounting region for the semiconductor chips, the leadframe is generally provided with holes or slots in order, in particular, to reduce mechanical stresses which might otherwise lead to fracture of the assemblage composed of a multiplicity of components. However, there is the risk of plastic material undesirably reaching the rear side of the leadframe through such openings in the leadframe during the compression molding or injection molding of housings and/or lens onto the components.

SUMMARY OF THE INVENTION

Embodiments of the invention specify an improved leadframe for producing a number of optoelectronic components. Embodiments are distinguished by low mechanical stresses, wherein at the same time there is no risk of plastic material penetrating through the leadframe in an undesirable manner during compression molding or injection molding. Furthermore, an embodiment method for producing a multiplicity of optoelectronic components comprising a leadframe of this type is described.

In accordance with at least one embodiment, the leadframe for producing a multiplicity of optoelectronic components comprises at least one mounting region provided for the chip mounting of a multiplicity of semiconductor chips. For this purpose, the mounting region advantageously comprises a multiplicity of chip mounting areas for a multiplicity of semiconductor chips which are arranged in a grid, for example. By way of example, the mounting region can comprise a multiplicity of chip mounting areas which are arranged in rows and columns and in this way form a chip grid. The chip mounting areas in the mounting region are structured, for example, by embossing, stamping or etching of the leadframe in order to form electrical connection pads which form the electrical connections for an optoelectronic component after the separation of the leadframe.

Alongside the mounting region, at at least one main area of the leadframe one or a plurality of grooves for reducing mechanical stresses in the leadframe are formed, said groove (s) not completely penetrating through the leadframe. It has advantageously been found that, by means of at least one or preferably a plurality of grooves formed alongside the mounting region in the leadframe, it is possible to reduce mechanical stresses in the leadframe. In this way, in particular, the risk of fracture of the leadframe during the simultaneous production of a multiplicity of optoelectronic components on the leadframe is reduced. The fact that the groove or the plurality of grooves does or do not completely penetrate through the leadframe in contrast to holes or slots at the same time prevents part of the plastic material from reaching the rear side of the leadframe in an undesirable manner during the compression molding or injection molding of a plastic onto the leadframe in order to form a housing and/or a lens. This would otherwise lead to contamination of the electrical contact areas and to soiling of the mold.

The at least one groove preferably has a depth which is advantageously at least 50% of the thickness of the leadframe. The depth is preferably at least 70%, particularly preferably at least 80%, of the thickness of the leadframe. In this way, mechanical stresses in the leadframe can be effectively reduced without forming holes or slots in the leadframe.

The at least one groove preferably has a depth of between 10 μm and 1 mm, particularly preferably a depth of between 100 μm and 200 μm.

The width of the at least one groove is preferably between 10 μm and 4 mm.

In one preferred configuration, the at least one groove is strip-shaped. The strip-shaped groove can have a rectangular cross section, for example.

The at least one strip-shaped groove preferably runs parallel to at least one side edge of the mounting region. It has been found that mechanical stresses can be reduced particularly effectively by one or preferably a plurality of strip-shaped grooves arranged parallel to the side edges of the mounting region.

In one particularly preferred configuration, a plurality of strip-shaped grooves are arranged parallel to one another. This advantageously reinforces the stress-reducing effect in comparison with an individual groove.

In a further configuration, the at least one groove is a round groove. In particular, the leadframe can comprise a plurality of round grooves arranged alongside one another. The plurality of round grooves arranged alongside one another are preferably arranged parallel to at least one side edge of the mounting region. Although a somewhat smaller reduction of the mechanical stresses is obtained by the round grooves in comparison with strip-shaped grooves, the stability of the leadframe is adversely affected to a lesser extent by the round grooves.

In a further advantageous configuration, both a first main area and a second main area of the leadframe respectively have at least one groove. That is to say that the leadframe has in each case one or a plurality of grooves both on a first main area provided for chip mounting and on the opposite second main area. In particular, it is possible for a plurality of grooves arranged alongside one another to be arranged alternately on the first and second main areas of the leadframe.

In one preferred configuration, the mounting region is surrounded on all sides by in each case one or a plurality of grooves. By way of example, the mounting region can be rectangular and surrounded by a strip-shaped, likewise rectangular, circumferential groove. Alternatively, it is also possible for the mounting region to be surrounded by a multiplicity of round grooves arranged in the form of a rectangle around the mounting region.

In a further advantageous configuration, the leadframe comprises a plurality of mounting regions, wherein the at least one groove is arranged between the mounting regions. Particularly preferably, one or a plurality of grooves is or are arranged between the mounting regions in such a way that they run parallel to the opposite side edges of the mounting regions. Particularly preferably, one or a plurality of strip-shaped grooves run parallel to one another between the mounting regions in such a way that they are arranged parallel to the opposite side edges of the mounting regions.

A particularly effective reduction of mechanical stresses can be obtained by virtue of one or a plurality of strip-shaped grooves running between the mounting regions continuously from a first side edge to a second side edge of the leadframe.

In a method for producing a multiplicity of optoelectronic components on a leadframe in accordance with one of the configurations described above, a multiplicity of optoelectronic semiconductor chips are mounted onto the chip mounting areas of the mounting region of the leadframe. The optoelectronic semiconductor chips can be, in particular, LED chips.

The optoelectronic semiconductor chips are subsequently provided in each case with a chip housing, a planar potting and/or a lens by compression molding, potting and/or injection molding. This method step can advantageously be effected simultaneously for all the semiconductor chips mounted on the mounting region.

The mounting region of the leadframe is subsequently singulated to form a multiplicity of individual optoelectronic components. This can be effected, for example, by means of the leadframe and, if appropriate, the housing, potting and/or lens material arranged thereon being separated by sawing, laser cutting, stamping or water jet cutting.

The fact that the leadframe has no openings or slots outside the mounting region reduces the risk of the plastic material for the production of the housing and/or the lens of the optoelectronic component reaching the rear side of the leadframe in an undesirable manner outside or at the edges of the mold used.

BRIEF DESCRIPTION OF THE DRAWINGS

The invention is explained in greater detail below on the basis of exemplary embodiments in connection with FIGS. 1 to 6.

Identical or identically acting constituent parts are in each case provided with the same reference symbols in the figures. The illustrated constituent parts and also the size relationships of the constituent parts among one another should not be regarded as true to scale.

DETAILED DESCRIPTION OF ILLUSTRATIVE EMBODIMENTS

Figure 1A:
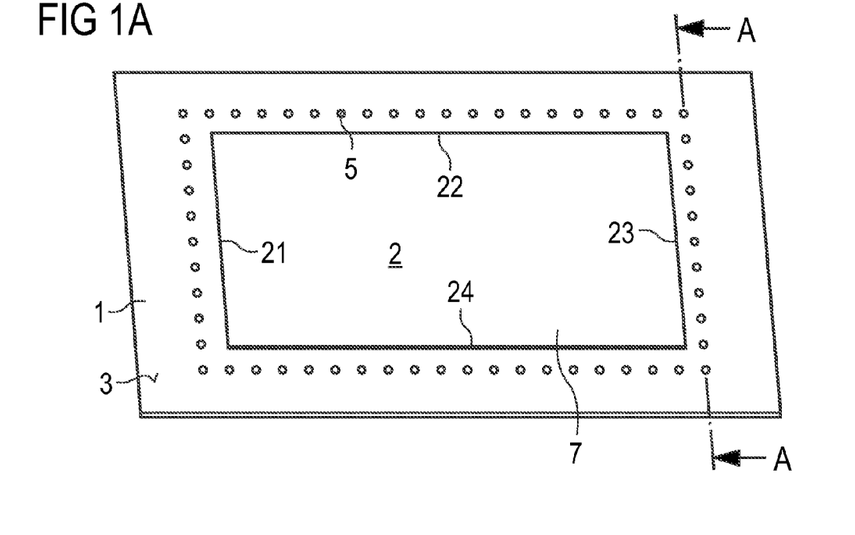
FIGS. 1A, 1B and 1C show a schematic illustration of a leadframe in accordance with a first exemplary embodiment in a plan view, a view from below and in cross section.
Figure 1B:
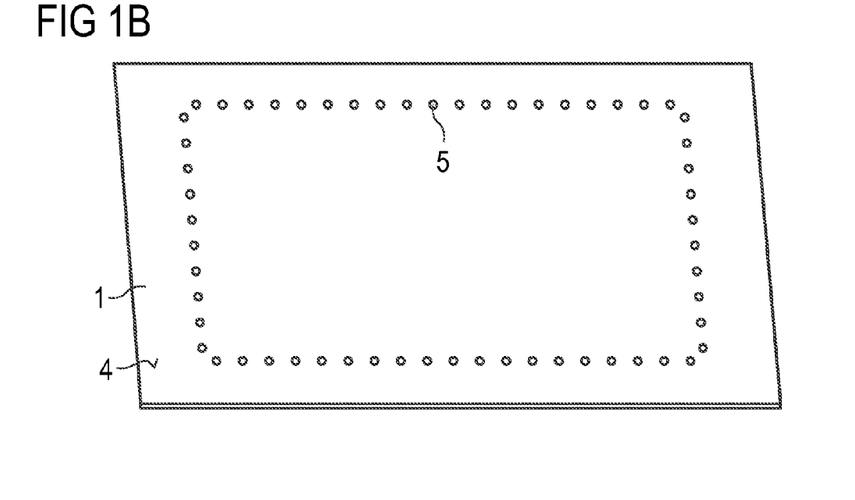

The leadframe 1 in accordance with a first exemplary embodiment as illustrated in a plan view of FIG. 1A, in a view from below in FIG. 1B and, in FIG. 1C, in a sectional view along the line A-A shown in FIG. 1A comprises a mounting region 2 for a multiplicity of semiconductor chips. The mounting region 2 can be rectangular, for example, and is delimited by side edges 21, 22, 23, 24, which jointly form the shape of a rectangle. The leadframe 1 has a first main area 3 comprising the mounting region, and an opposite second main area 4.

In order to reduce mechanical stresses in the leadframe 1, a multiplicity of round grooves 5 are in each case formed at the first main area 3 and the second main area 4. The mounting region 2 is advantageously surrounded on all sides by the round grooves 5, wherein the round grooves 5 are arranged parallel to the side edges 21, 22, 23, 24 of the mounting region 2. In particular, the round grooves 5 are arranged on the contour of a rectangle in such a way that they are in each case at the same distance from the side edges 21, 22, 23, 24 of the mounting region 2. Since the mounting region 2 is rectangular, in this case the round grooves 5 are also arranged at a distance from the mounting region 2 on the contour of a rectangle.

In the exemplary embodiment, the round grooves 5 have a depth which is more than 80% of the thickness of the leadframe 1. In particular, the grooves 5 can have a depth of between 10 μm and 1 mm, particularly preferably between 100 μm and 200 μm. The width of the grooves 5 is preferably between 10 μm and 4 mm.

Figure 1C:
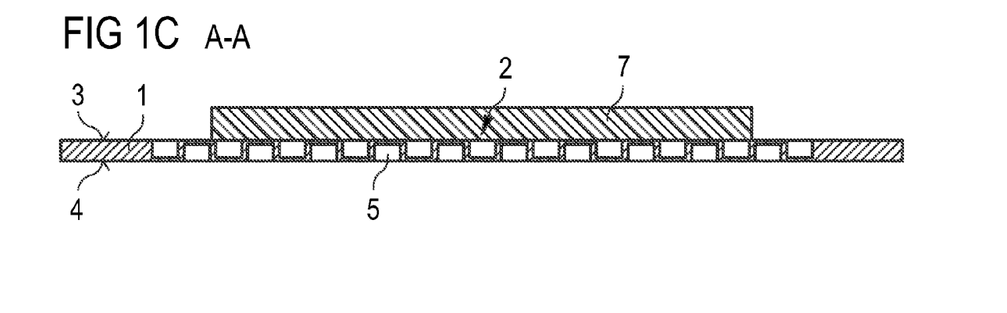

As can be discerned in the cross section illustrated in FIG. 1C, the round grooves 5 are arranged in such a way that the grooves 5 arranged alongside one another are respectively arranged alternately on the first main area 3 and the second main area 4 of the leadframe 1. This arrangement of the round grooves 5 advantageously results in a reduction of mechanical stresses in the leadframe 1. In this case, the stability of the leadframe 1 is only slightly adversely affected by the multiplicity of round grooves 5.

The mounting region 2 comprises, for example, a multiplicity of chip mounting areas for a multiplicity of semiconductor chips. The chip mounting areas can be arranged, in particular, in a grid composed of a multiplicity of rows and columns. After the mounting of the semiconductor chips (not illustrated), by way of example, by means of a compression molding press and/or by potting or injection molding, one or a plurality of plastics 7 can be applied to the chip mounting areas equipped with the semiconductor chips, in order, e.g., to form chip housings and/or lenses for the semiconductor chips. The at least one plastic 7 can be, in particular, a thermoplastic, thermosetting plastic or elastomer. The structuring of the plastic 7 to form individual chip housings and/or lenses is not shown in FIGS. 1A and 1C in order to simplify the illustration.

The fact that the round grooves 5 do not completely penetrate through the leadframe 1 reduces the risk of part of the plastic material reaching the second main area 4 of the leadframe 1 in an undesirable manner during the application of the plastic 7 to the mounting region 2. This risk would exist particularly if holes or slots were formed in the leadframe 1 in order to reduce mechanical stresses.

Figure 2A:
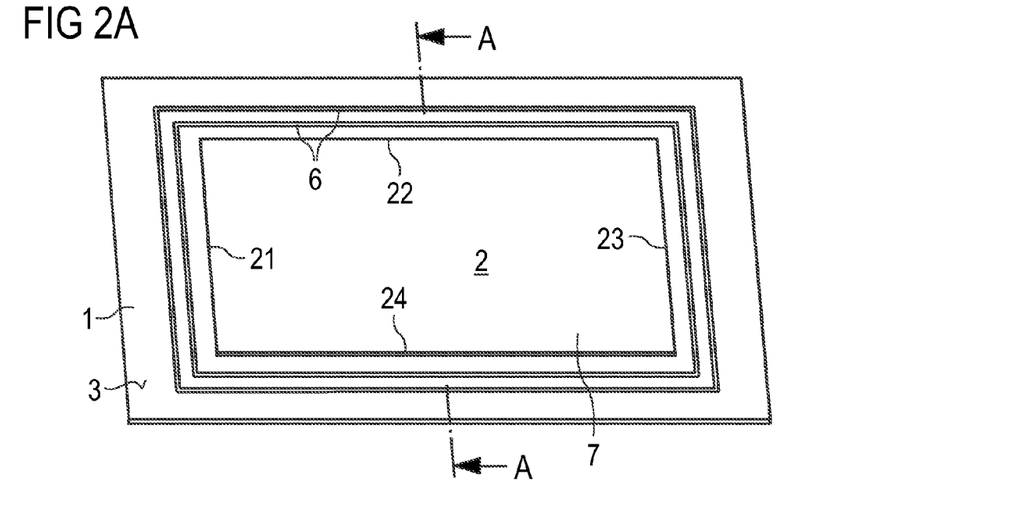
FIGS. 2A, 2B and 2C show a schematic illustration of a leadframe in accordance with a second exemplary embodiment in a plan view, a view from below and in cross section.
Figure 2B:
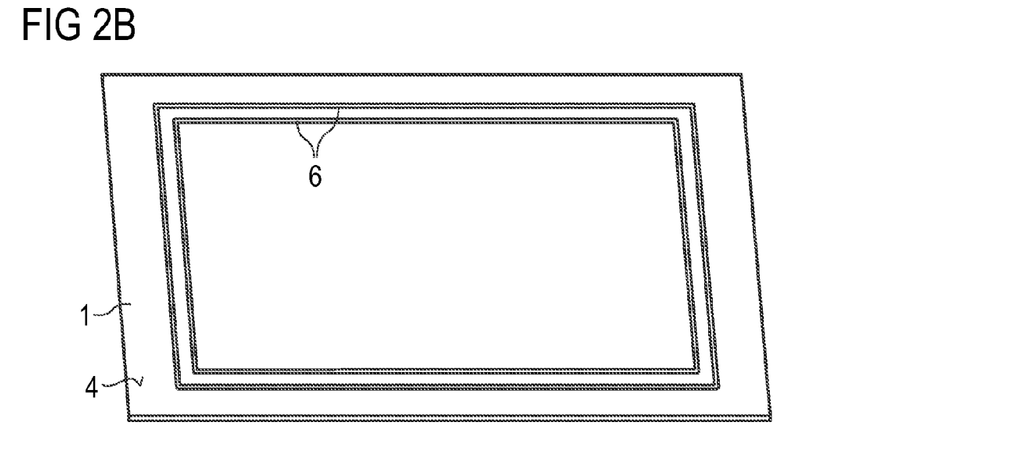
Figure 2C:
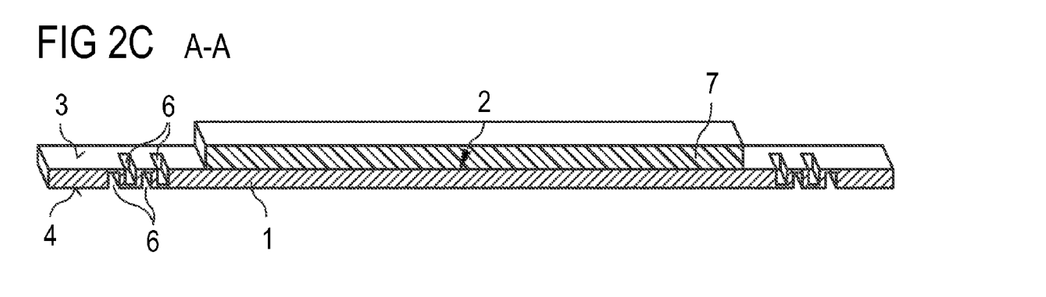

The second exemplary embodiment of a leadframe as illustrated in a plan view in FIG. 2A, in a view from below in FIG. 2B and, in FIG. 2C, in a sectional view along the line A-A shown in FIG. 2A differs from the first exemplary embodiment in that the leadframe 1 is surrounded on all sides by strip-shaped grooves 6 instead of round grooves. In each case two strip-shaped grooves 6 are formed both on the first main area 3 and on the second main area 4 of the leadframe, said grooves running parallel to one another and parallel to the side edges 21, 22, 23, 24 of the mounting region 2 and completely enclosing the mounting region 2. The strip-shaped grooves 6 are arranged on the first main area 3 and the second main area 4 in such a way that a strip-shaped groove 6 on the first main area 3 and a strip-shaped groove 6 on the second main area 4 respectively alternate with one another. With regard to further details and advantageous configurations, the second exemplary embodiment corresponds to the first exemplary embodiment.

Figure 3A:
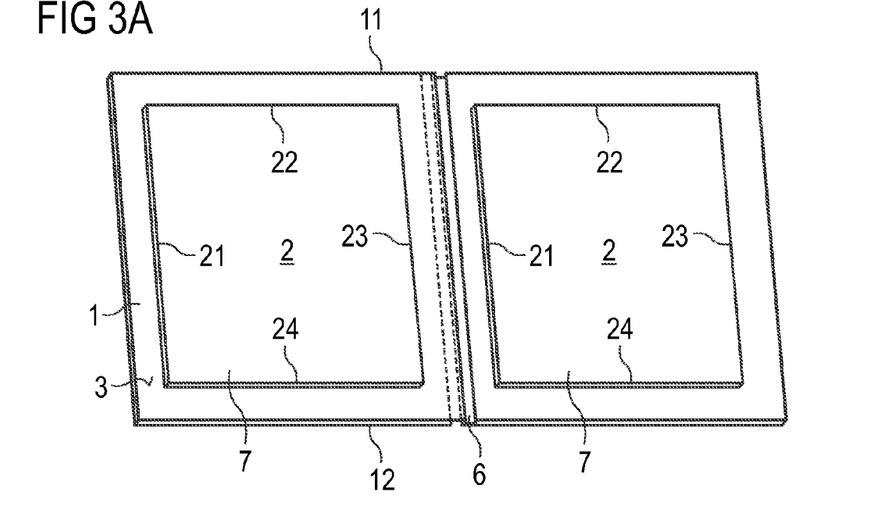
FIGS. 3A, 3B and 3C show a schematic illustration of a leadframe in accordance with a third exemplary embodiment in a plan view, a view from below and in cross section.
Figure 3B:
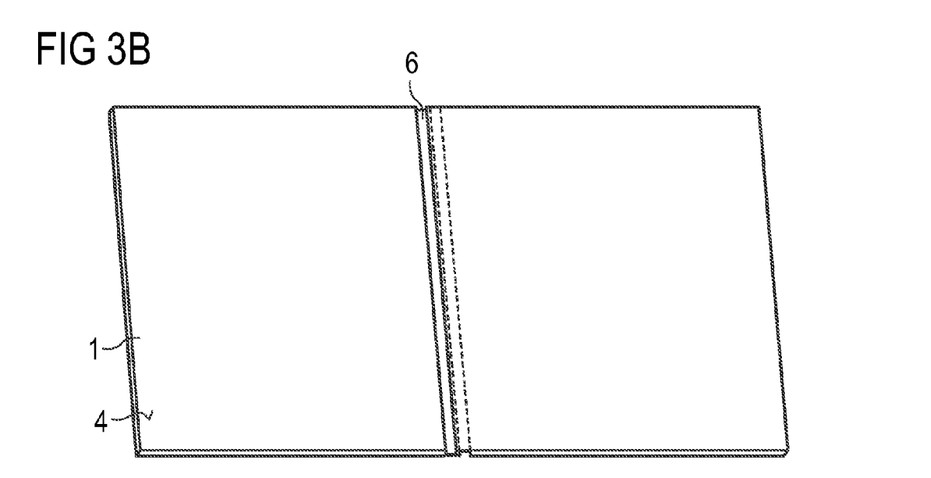
Figure 3C:
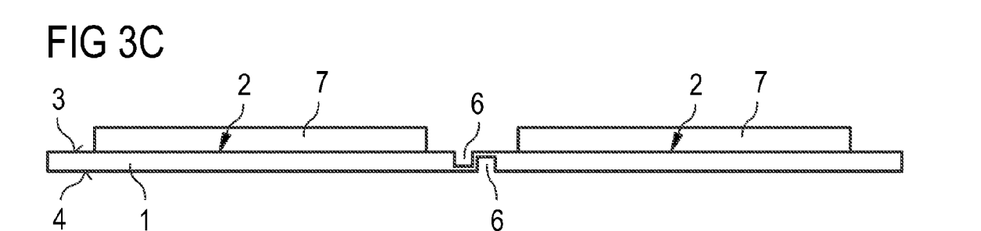

The third exemplary embodiment of a leadframe 1 as illustrated in a plan view in FIG. 3A, in a view from below in FIG. 3B and in cross section in FIG. 3C comprises two mounting regions 2 arranged alongside one another, which are provided in each case for the mounting of a multiplicity of semiconductor chips. In order to reduce mechanical stresses in the leadframe 1, two strip-shaped grooves 6 running alongside one another parallel to one another are formed between the mounting regions 2 at the first main area 3 and the second main area 4. The two strip-shaped grooves 6 run parallel to the side edges 21, 23 of the mounting regions 2. Preferably, the strip-shaped grooves 6 run continuously from a first side edge 11 to a second side edge 12 of the leadframe 1. Mechanical stresses can be reduced particularly effectively by continuous strip-shaped grooves 6 of this type. With regard to further details and advantageous configurations, the third exemplary embodiment corresponds to the first exemplary embodiment.

Figure 4A:
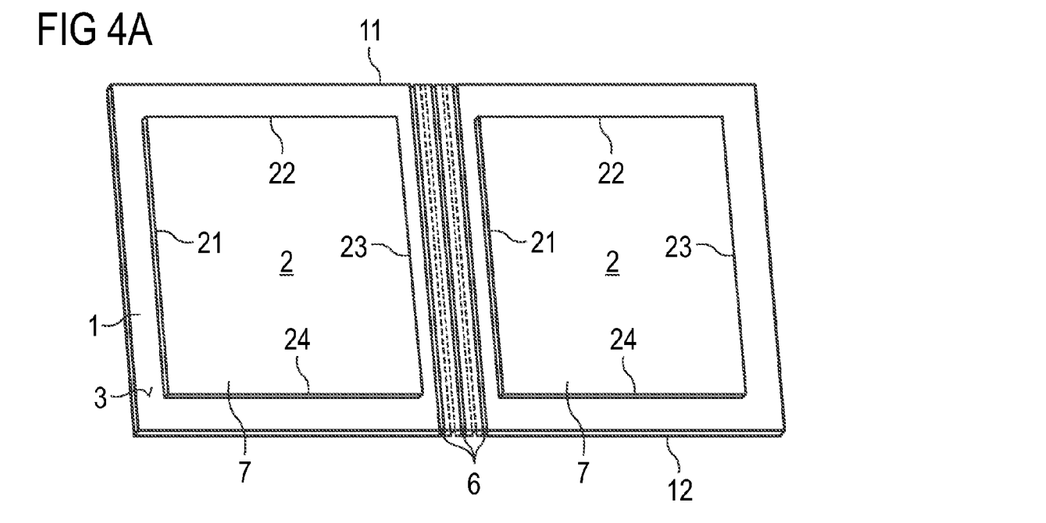
FIGS. 4A, 4B and 4C show a schematic illustration of a leadframe in accordance with a fourth exemplary embodiment in a plan view, a view from below and in cross section.
Figure 4B:
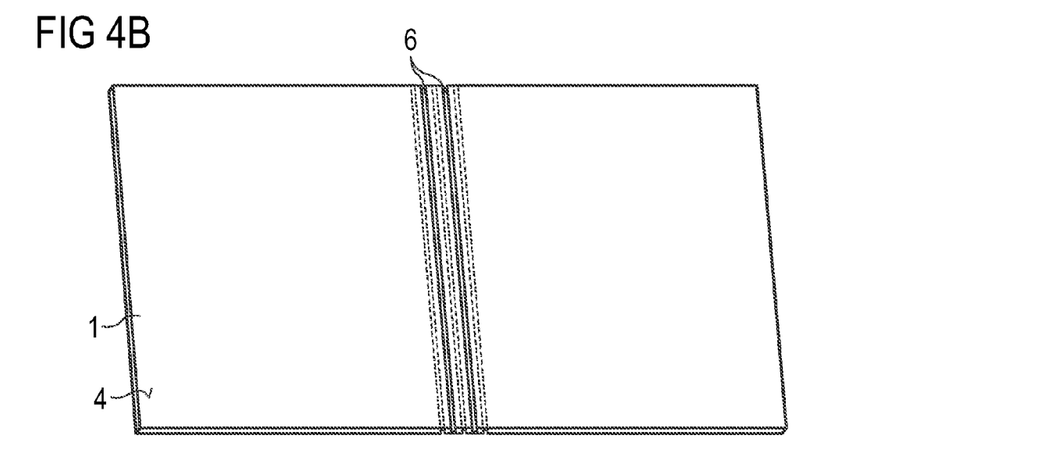
Figure 4C:
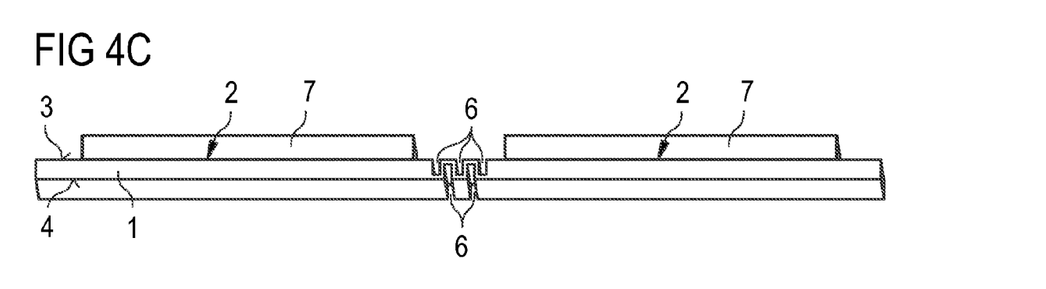

The fourth exemplary embodiment of a leadframe 1 as illustrated in a plan view in FIG. 4A, in a view from below in FIG. 4B and in cross section in FIG. 4C comprises two mounting regions 2 arranged alongside one another. The fourth exemplary embodiment differs from the third exemplary embodiment in that between the two mounting regions 2, instead of one groove in each case, three parallel grooves 6 on the first main area 3 and two parallel grooves 6 on the second main area 4 are formed between the mounting regions. The plurality of strip-shaped grooves 6 arranged alongside one another are formed alternately on the first main area 3 and the second main area 4 of the leadframe 1. As in the third exemplary embodiment, the plurality of strip-shaped grooves 6 advantageously run continuously from a first side edge 11 to a second side edge 12 of the leadframe 1. In this way, mechanical stresses in the leadframe 1 are advantageously reduced even better than in the third exemplary embodiment.

Figure 5A:
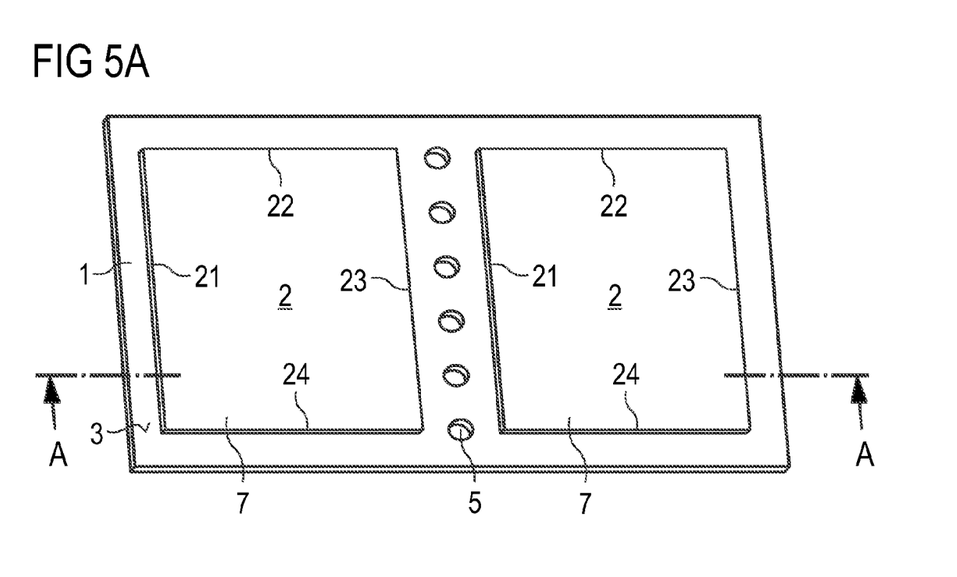
FIGS. 5A, 5B and 5C show a schematic illustration of a leadframe in accordance with a fifth exemplary embodiment in a plan view, a view from below and in cross section.
Figure 5B:
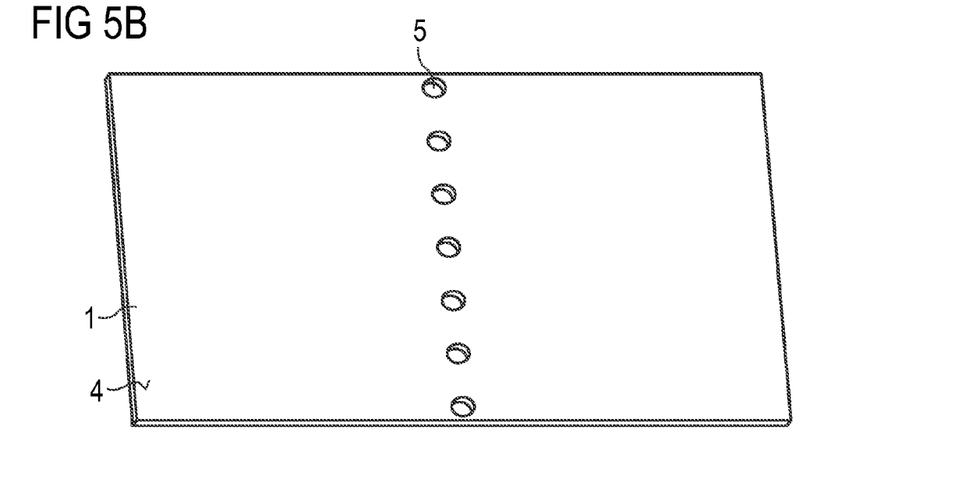
Figure 5C:
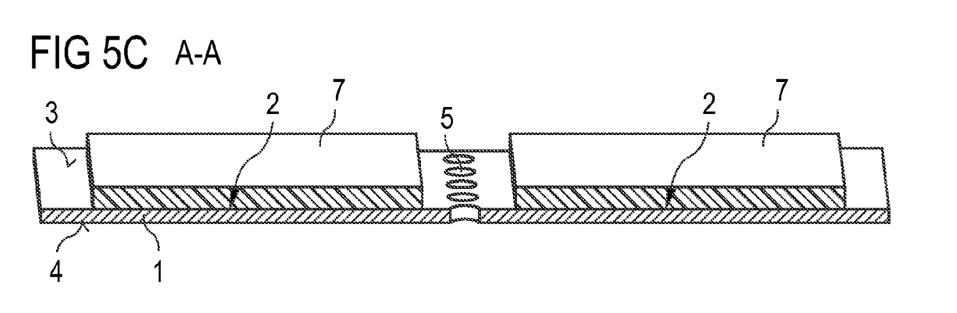

As in the two preceding exemplary embodiments, the leadframe 1 in the fifth exemplary embodiment illustrated in a plan view in FIG. 5A, in a view from below in FIG. 5B and, in FIG. 5C, in a sectional view along the line A-A shown in FIG. 5A also comprises two mounting regions 2. It differs from the two preceding exemplary embodiments in that, instead of strip grooves, a plurality of round grooves 5 are arranged between the mounting regions 2. The round grooves 5 are advantageously arranged centrally between the mounting regions 2 on a line running parallel to the side edges 21, 23 of the mounting regions 2. The round grooves 5 adversely affect the stability of the leadframe 1 to a lesser extent in comparison with strip-shaped grooves 6.

Figure 6A:
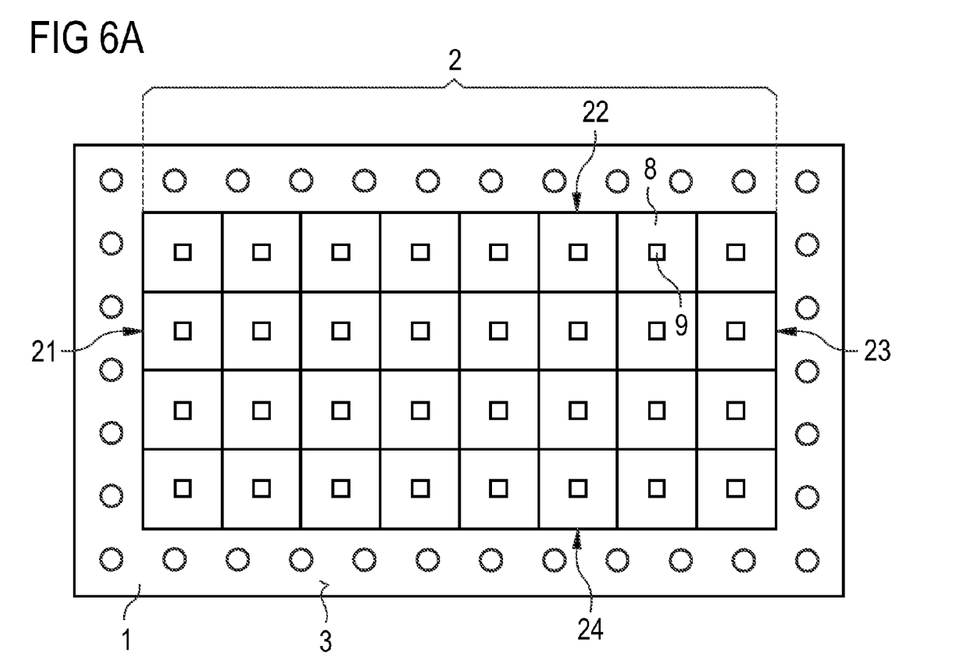
FIGS. 6A, 6B and 6C show a schematic illustration of an exemplary embodiment of the method for producing a multiplicity of optoelectronic components on the basis of intermediate steps.
Figure 6B:
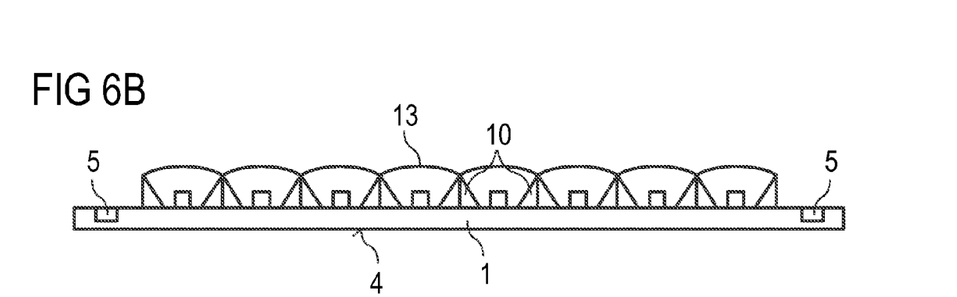
Figure 6C:
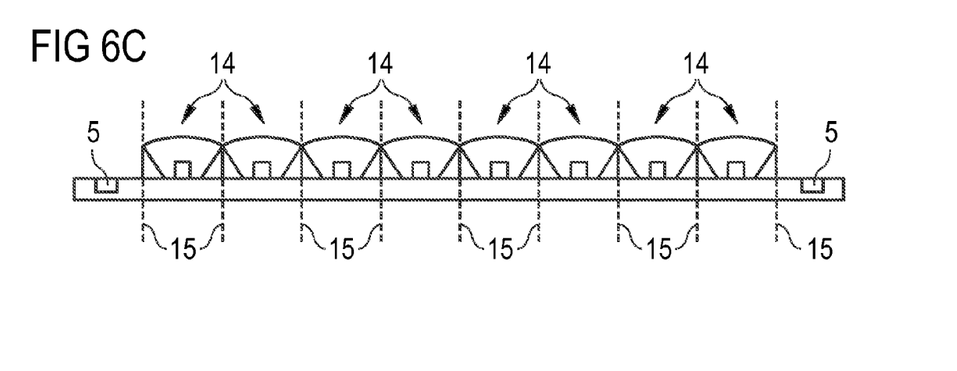

FIGS. 6A to 6c illustrate one exemplary embodiment of the method for producing a multiplicity of optoelectronic components on the basis of intermediate steps.

The method involves firstly providing a leadframe 1, as is illustrated in a plan view, for example, in FIG. 6A. Alternatively, the leadframe 1 can also have one of the configurations described above.

The leadframe 1 comprises a mounting region 2 for a multiplicity of semiconductor chips 9. The mounting region 2 can be rectangular, for example, and is delimited by side edges 21, 22, 23, 24, which jointly form the shape of a rectangle. The leadframe 1 has a first main area 3 comprising the mounting region 2.

In order to reduce mechanical stresses in the leadframe 1, a multiplicity of round grooves 5 are formed at the first main area of the leadframe 1. The mounting region 2 is advantageously surrounded on all sides by the round grooves 5, wherein the round grooves 5 are arranged parallel to the side edges 21, 22, 23, 24 of the mounting region 2. In particular, the round grooves 5 are arranged on the contour of a rectangle in such a way that they are in each case at the same distance from the side edges 21, 22, 23, 24 of the mounting region 2. Since the mounting region 2 is rectangular, in this case the round grooves 5 are also arranged at a distance from the mounting region 2 on the contour of a rectangle.

The mounting region 2 comprises, for example, a multiplicity of chip mounting areas 8 for a multiplicity of semiconductor chips. The chip mounting areas 8 can be arranged, in particular, in a grid composed of a multiplicity of rows and columns. The semiconductor chips 9 can be LED chips, in particular.

As illustrated in a schematic cross-sectional view of the leadframe 1 in FIG. 6B, after the mounting of the semiconductor chips 9, by way of example, by means of a compression molding press and/or by potting or injection molding, one or a plurality of plastics 7 are applied to the chip mounting areas 8 equipped with the semiconductor chips 9 in order, for example, to form chip housings 10 and/or lenses 13 for the semiconductor chips 9. In particular, by way of example, chip housings 10 can be produced by means of the compression molding of a thermoplastic, thermosetting plastic or elastomer, and, in a further method step, lenses 13 can be produced by the compression molding, potting or injection molding of a silicone.

The fact that the grooves 5 do not completely penetrate through the leadframe 1, in contrast to holes or slots, prevents part of the plastic material from reaching the second main area 4 of the leadframe 1 in an undesirable manner during the compression molding, potting or injection molding of the plastics 7 onto the leadframe 1.

As illustrated schematically in FIG. 6C, in a further method step, the leadframe 1 is singulated to form individual optoelectronic components 14 by being separated, for example, along the dashed lines 15 illustrated. The separation can be effected, for example, by sawing, stamping, laser beam cutting or water jet cutting.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A leadframe for use with optoelectronic components, the leadframe comprising:
   at least one mounting region comprising a plurality of chip mounting areas for a plurality of semiconductor chips; and
   alongside the mounting region at both a first main area and a second main area of the leadframe, a plurality of grooves for reducing mechanical stresses in the leadframe, the grooves not completely penetrating through the leadframe;
   wherein the grooves arranged alongside one another are arranged alternately on the first main area and the second main area of the leadframe.

2. The leadframe according to claim 1, wherein the groove has a depth which is at least 50% of a thickness of the leadframe.

3. The leadframe according to claim 1, wherein the groove has a depth of between 10 μm and 1 mm.

4. The leadframe according to claim 1, wherein the groove has a width of between 10 μm and 4 mm.

5. The leadframe according to claim 1, wherein the groove is strip-shaped.

6. The leadframe according to claim 5, wherein the strip-shaped groove is arranged parallel to at least one side edge of the mounting region.

7. The leadframe according to claim 5, wherein a plurality of strip-shaped grooves are arranged parallel to one another.

8. The leadframe according to claim 1, wherein the groove is a round groove.

9. The leadframe according to claim 8, wherein the leadframe has a plurality of round grooves arranged alongside one another.

10. The leadframe according to claim 9, wherein the plurality of round grooves arranged alongside one another are arranged parallel to at least one side edge of the mounting region.

11. The leadframe according to claim 9, wherein both a first main area and a second main area of the leadframe respectively have a groove.

12. The leadframe according to claim 1, wherein the mounting region is surrounded on all sides by one or more grooves.

13. The leadframe according to claim 1, wherein the leadframe comprises a plurality of mounting regions and where the groove is arranged between the mounting regions.

14. A leadframe for use with optoelectronic components, the leadframe comprising:
   a plurality of mounting regions comprising a plurality of chip mounting areas for a plurality of semiconductors chips; and
   alongside the mounting regions at both a first main area and a second main area of the leadframe, a plurality of grooves for reducing mechanical stresses in the leadframe, the grooves not completely penetrating through the leadframe;
   wherein the grooves arranged alongside one another are arranged alternately on the first main area and the second main area of the leadframe; and
   wherein the grooves are arranged between the mounting regions.

* * * * *